United States Patent [19]
Gallup et al.

[11] Patent Number: 4,703,203
[45] Date of Patent: Oct. 27, 1987

[54] BICMOS LOGIC HAVING THREE STATE OUTPUT

[75] Inventors: Michael G. Gallup, Austin, Tex.; Kevin L. McLaughlin, Chandler, Ariz.

[73] Assignee: Motorola, Inc., Schaumburg, Ill.

[21] Appl. No.: 914,970

[22] Filed: Oct. 3, 1986

[51] Int. Cl.$^4$ ............................................. H03K 19/017
[52] U.S. Cl. ..................................... 307/446; 307/451; 307/454; 307/473; 307/475; 307/570
[58] Field of Search ............... 307/443, 446, 451, 454, 307/473, 475, 570, 270, 300

[56] References Cited

U.S. PATENT DOCUMENTS

| | | | |
|---|---|---|---|
| 4,280,065 | 7/1981 | Minato et al. | 307/473 |
| 4,363,978 | 12/1982 | Heimbigner | 307/473 X |
| 4,491,749 | 1/1985 | Iwamura | 307/473 |
| 4,585,958 | 4/1986 | Chung et al. | 307/473 |
| 4,612,466 | 9/1986 | Stewart | 307/473 X |
| 4,616,146 | 10/1986 | Lee et al. | 307/451 X |
| 4,638,186 | 1/1987 | McLaughlin | 307/446 |
| 4,649,294 | 3/1987 | McLaughlin | 307/451 X |

Primary Examiner—Stanley D. Miller
Assistant Examiner—D. R. Hudspeth
Attorney, Agent, or Firm—William E. Koch

[57] ABSTRACT

A BICMOS three state gate is provided having high noise immunity, low power requirements, high drive capability, and good output signal switching characteristics. A first bipolar transistor has its collector-emitter path coupled between a first voltage terminal and an output terminal. A second bipolar transistor has its collector-emitter path coupled between the output terminal and a second voltage terminal. A first MOS circuit is coupled between first and second voltage terminals and to the first input terminal and a base of the first bipolar transistor for biasing the first bipolar transistor. A second MOS circuit is coupled between the base of the first bipolar transistor and the second voltage terminal and to the first input terminal and a base of the second bipolar transistor for biasing the second bipolar transistor. A third MOS circuit is coupled between a second input terminal and both of the first and second MOS circuits for disabling the first and second bipolar transistors.

5 Claims, 2 Drawing Figures

BICMOS LOGIC HAVING THREE STATE OUTPUT

FIELD OF THE INVENTION

This invention relates, in general, BICMOS logic and more particularly to a BICMOS three state gate having high noise immunity, low power requirements, high drive capability, and good output signal switching characteristics.

BACKGROUND OF THE INVENTION

Three state gates have an output which is capable of assuming an active high, an active low, or a high impedance state. Conventional bipolar three state gates comprise a push-pull output driver stage, a phase splitting stage, and a high impedance enable stage. The push-pull output driver stage comprises a dual transistor arrangement wherein a first NPN transistor is coupled between a DC voltage supply and an output load, and a second NPN transistor is coupled between the output load and ground. In operation, a high output voltage is realized at the output terminal by turning on the first NPN transistor and turning off the second NPN transistor; a low output voltage is realized by turning off the first NPN transistor and turning on the second NPN transistor; and a high impedance is achieved by turning off both transistors. The phase splitting stage comprises a bipolar transistor coupled between the bases of the first and second NPN transistors that would selectively turn on one of the first and second NPN transistors. A high impedance enable stage typically comprises diodes coupled to both the phase splitting stage and the output stage for disabling the first and second NPN transistors.

One previously known CMOS three state gate comprises a push-pull output driver stage and an input stage. The push-pull output driver stage comprises a dual transistor arrangement wherein a P-channel transistor is coupled between voltage supply $V_{DD}$ and an output load, and an N-channel transistor is coupled between the output load and voltage supply $V_{SS}$. In operation, a high output voltage is realized at the output terminal by turning on the P-channel transistor and turning off the N-channel transistor; a low output voltage is realized by turning off the P-channel transistor and turning on the N-channel transistor; and a high impedance is achieved by turning off both transistors. The input stage comprises CMOS transistors coupled to the gates of the P-channel and N-channel transistors that would selectively turn on one of the P-channel and N-channel transistors or disable both the P-channel and N-channel transistors.

The bipolar three state gate provides fast gate speeds, high drive capability, improved output signal switching characteristics and reduced delay per unit load, but has lower noise immunity and higher power requirements than the conventional CMOS three state gate. The CMOS three state gate provides high noise immunity and low power requirements, but is generally slower and has lower drive capability than the conventional bipolar three state gate.

Thus, a need exists for an improved three state gate having high noise immunity, low power requirements, high drive capability, and improved output signal switching characteristics.

SUMMARY OF THE INVENTION

Accordingly, it is an object of the present invention to provide an improved three state gate.

Another object of the present invention is to provide a BICMOS three state gate having high noise immunity.

Yet another object of the present invention is to provide a BICMOS three state gate having low power requirements.

Still another object of the present invention is to provide a BICMOS three state gate having high drive capability.

A further object of the present invention is to provide a BICMOS three state gate having improved output signal switching characteristics.

In carrying out the above and other objects of the invention in one form, there is provided an improved BICMOS three state gate wherein a first bipolar transistor has its collector-emitter path coupled between a first voltage terminal and an output terminal. A second bipolar transistor has its collector-emitter path coupled between the output terminal and a second voltage terminal. A first MOS circuit is coupled between first and second voltage terminals and to the first input terminal and a base of the first bipolar transistor for biasing the first bipolar transistor. A second MOS circuit is coupled between the base of the first bipolar transistor and the second voltage terminal and to the first input terminal and a base of the second bipolar transistor for biasing the second bipolar transistor. A third MOS circuit is coupled between a second input terminal and both of the first and second MOS circuits for disabling the first and second bipolar transistors.

The above and other objects, features, and advantages of the present invention will be better understood from the following detailed description taken in conjunction with the accompanying drawings.

DETAILED DESCRIPTION OF THE INVENTION

Figure 1:
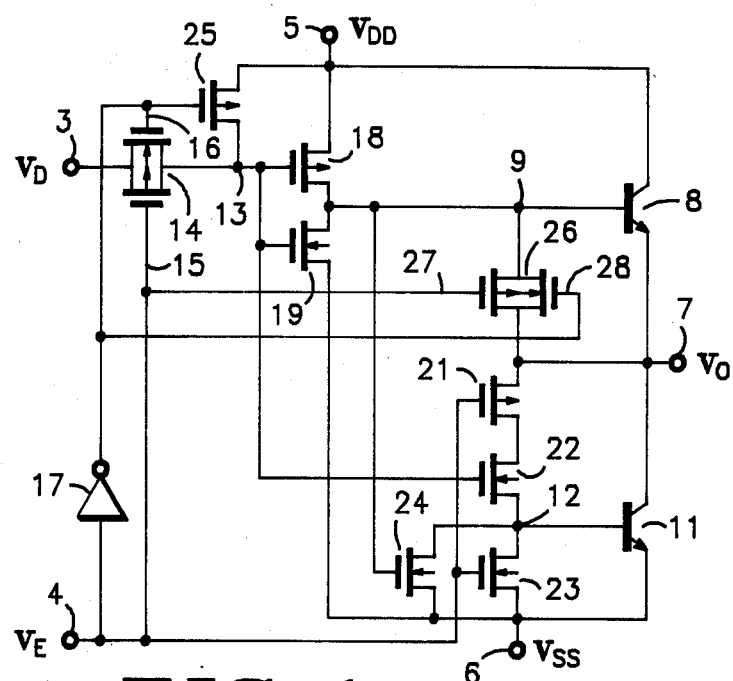
FIG. 1 is a schematic of a first embodiment of the present invention.

Referring to FIG. 1, a three state gate in accordance with the present invention is shown which is suitable to be fabricated in monolithic integrated circuit form and comprises input terminals 3 and 4 for receiving digital data input signal $V_D$ and digital enable input signal $V_E$, respectively, supply voltage terminals 5 and 6 for receiving voltages $V_{DD}$ and $V_{SS}$, respectively, and output terminal 7 for providing output signal $V_O$.

Input terminal 3 is coupled to node 13 by transmission gate 14. Gate 15 of transmission gate 14 is connected to input terminal 4 and gate 16 of transmission gate 14 is coupled to input terminal 4 by inverter 13 so that when digital enable input signal $V_E$ is low, digital data input signal $V_D$ will be transmitted to node 13. P-channel transistor 18 has a source connected to voltage terminal 5, a drain connected to node 9, and a gate connected to node 13 and supplies voltage $V_{DD}$ to node 9 when digital input signal $V_D$ is low. N-channel transistor 19 has a source connected to voltage terminal 6, a drain connected to voltage node 9, and a gate connected to node 13 for removing voltage from node 9 when digital input signal $V_D$ is high.

P-channel transistor 21 has a source connected to output terminal 7, a drain connected to the drain of N-channel transistor 22, and a gate connected to input terminal 4, and transistor 22 has a source connected to node 12 and a gate connected to node 13, for suppling any voltage on output terminal 7 to node 12 when digital data and digital enable input signals $V_D$ and $V_E$ are high and low, respectively. N-channel transistor 23 has a source connected to voltage terminal 6, a drain connected to node 12 and a gate connected to input terminal 4 for removing voltage from node 12 when digital enable input signal is high. N-channel transistor 24 has a source connected to voltage terminal 6, a drain connected to node 12 and a gate connected to node 9 for removing voltage from node 12 when node 9 is high. P-channel transistor 25 has a source connected to voltage terminal 5, a drain connected to node 13 and a gate coupled to input terminal 4 by inverter 17 for providing voltage $V_{DD}$ to node 13 when digital enable input signal $V_E$ is high.

NPN transistor 8 has a collector connected to voltage terminal 5, an emitter connected to output terminal 7, and a base connected to node 9. NPN transistor 11 has a collector connected to output terminal 7, an emitter connected to voltage terminal 6, and a base connected to node 12. Transistors 8 and 11 provide voltage $V_{DD}$ minus the base-emitter voltage of transistor 8, voltage $V_{SS}$ plus the base-emitter voltage of transistor 11, or a high impedance at output terminal 7 depending on the voltage state of nodes 9 and 12.

Optional transmission gate 26 is coupled between node 9 and output terminal 7 and has gate 27 connected to input terminal 4 and gate 28 coupled to input terminal 4 by inverter 17 to provide voltage $V_{DD}$ or $V_{SS}$ to output terminal 7 depending upon the states of transistors 18 and 19 and enable input signal $V_E$, therefore giving a wider range of output voltage on terminal 7.

When enable input signal $V_E$ is low, transmission gates 14 and 26 and transistor 21 are on, and transistors 23 and 25 are off, thereby allowing the state of data input signal $V_D$ to determine the state of output signal $V_O$. When data input signal $V_D$ is low, transistors 18 and 8 are on and transistors 19 and 22 are off, providing voltage $V_{DD}$ to output terminal 7. Transistor 24 is on, thereby ensuring transistor 11 is off. When data input signal $V_D$ is high, transistors 18, 24 and 8 are off and transistors 19, 22 and 11 are on so that output voltage $V_O$ goes to voltage $V_{SS}$.

When enable input signal $V_E$ is high, transmission gates 14 and 26 and transistor 21 are off, and transistors 19, 23 and 25 are on, thereby disconnecting output terminal 7 from either of voltage terminals 5 or 6, providing a high impedance at output terminal 7.

Although NPN transistors are shown, it is understood that PNP transistors may be substituted in their place. Furthermore, P-channel transistors may be used in place of N-channel transistors and N-channel transistors may be used in place of P-channel transistors with slight modifications in the circuit.

Figure 2:
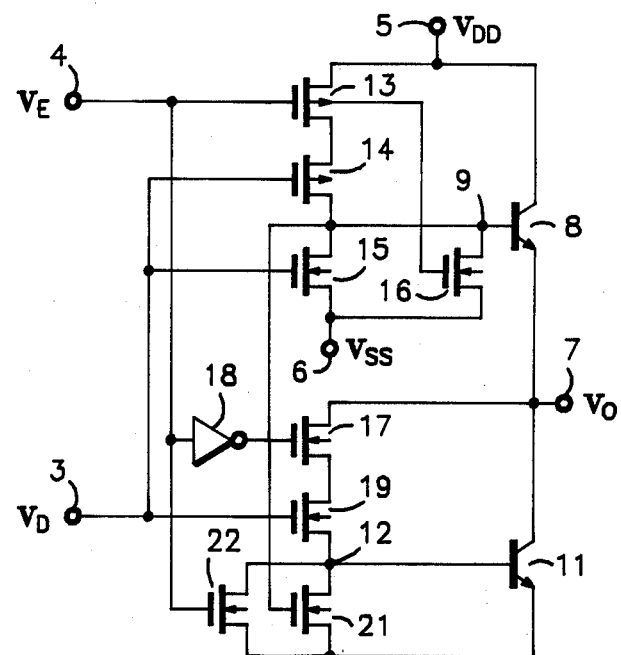
FIG. 2 is a schematic of a second embodiment of the present invention.

Referring to FIG. 2, a second embodiment of the three state gate in accordance with the present invention is shown which is suitable to be fabricated in monolithic integrated circuit form and similarly comprises input terminals 3 and 4 for receiving digital data input signal $V_D$ and digital enable input signal $V_E$, respectively, supply voltage terminals 5 and 6 for receiving voltages $V_{DD}$ and $V_{SS}$, respectively, and output terminal 7 for providing output signal $V_O$.

P-channel transistor 13 has a source connected to voltage terminal 5, a gate connected to input terminal 4 and a drain connected to the source of P-channel transistor 14 and transistor 14 has a gate connected to input terminal 3 and a drain connected to node 9 for suppling voltage $V_{DD}$ to node 9 when enable input signal $V_E$ and data input signal $V_D$ are both low. N-channel transistors 15 and 16 have their drains connected to node 9, their sources connected to voltage terminal $V_{SS}$, and their gates connected to input terminals 3 and 4, respectively, for removing voltage from node 9 when either of input signals $V_D$ or $V_E$ are high.

N-channel transistor 17 has a drain connected to output terminal 7, a gate coupled to input terminal 4 by inverter 18, and a source connected to the drain of N-channel transistor 19, and transistor 19 has a gate connected to input terminal 3 and a source connected to node 12 for supplying a voltage on output terminal 7 to node 12 when input signals $V_E$ and $V_D$ are low and high, respectively. N-channel transistors 21 and 22 have their drains connected to node 12, their sources connected to voltage terminal 6, and their gates connected to node 9 and input terminal 4, respectively, for removing a voltage from node 12 when either node 9 or enable input signal $V_E$ are high.

NPN transistor 8 has a collector connected to voltage terminal 5, an emitter connected to output terminal 7, and a base connected to node 9. NPN transistor 11 has a collector connected to output terminal 7, an emitter connected to voltage terminal 6, and a base connected to node 12. Transistors 8 and 11 provide voltage $V_{DD}$ minus the base-emitter voltage of transistor 8, voltage $V_{SS}$ plus the base-emitter voltage of transistor 11, or a high impedance at output terminal 7 depending on the voltage state of nodes 9 and 12.

When enable input signal $V_E$ is low, transistors 13 and 17 are on and transistors 16 and 22 are off, thereby allowing the state of data input signal $V_D$ determine the state of output signal $V_O$. When data input signal $V_D$ is low, transistor 14 is on, and transistors 15 and 19 are off providing voltage $V_{DD}$ minus the base-emitter voltage of transistor 8 to output terminal 7. Transistor 21 is on, thereby ensuring transistor 11 is off. When data input signal $V_D$ is high, transistors 14 and 21 are off, and transistors 15 and 19 are on so that output voltage $V_O$ goes to voltage $V_{SS}$ plus the base-emitter voltage of transistor 11.

When enable input signal $V_E$ is high, transistors 13 and 17 are off and transistors 16 and 22 are on, thereby disconnecting output terminal 7 from either of voltage terminals 5 or 6, providing a high impedance at output terminal 7.

Although NPN transistors are shown, it is understood that PNP transistors may be substituted in their place. Furthermore, P-channel transistors may be used in place of N-channel transistors and N-channel transistors may be used in place of P-channel transistors with slight modifications in the circuit.

By now it should be appreciated that there has been provided a BICMOS three state gate having high noise immunity, low power requirements, high drive capability, and improved output signal switching characteristics.

We claim:
1. A BICMOS logic circuit comprising:
a first input terminal;
a second input terminal;
an output terminal;

a first voltage terminal;

a second voltage terminal;

a first bipolar transistor having its collector-emitter path coupled between said first voltage terminal and said output terminal and having a base;

a second bipolar transistor having its collector-emitter path coupled between said output terminal and said second voltage terminal and having a base;

a first CMOS transistor having its source-drain current path coupled between said first voltage terminal and said base of said first bipolar transistor and a gate;

a second CMOS transistor having its source-drain current path coupled between said said base of said first bipolar transistor and said second voltage terminal and a gate;

a third CMOS transistor having a gate, a source and a drain;

a fourth CMOS transistor having its source-drain current path coupled between said base of said second bipolar transistor and said second voltage terminal and a gate coupled to said base of said first bipolar transistor;

first transmission means coupled between said first input terminal and said gates of said first, second, and third CMOS transistors and coupled to said second input terminal for coupling said first input terminal to said gates of said first, second and third CMOS transistors in response to an input signal on said second input terminal;

a fifth CMOS transistor having its source-drain current path coupled between said first voltage terminal and said gate of said first CMOS transistor and a gate coupled to said second input terminal;

a sixth CMOS transistor having its source-drain current path coupled to said source-drain current path of said third CMOS transistor, said source-drain current paths of said third and sixth CMOS transistors coupled between said output terminal and said base of said second bipolar transistor, and a gate coupled to said second input terminal; and a seventh CMOS transistor having its source-drain current path coupled between said base of said second bipolar transistor and said second voltage terminal and a gate coupled to said said second input terminal.

2. The BICMOS logic circuit according to claim 1 further comprising an inverter coupled between said second input terminal and said gate of said fifth CMOS transistor.

3. The BICMOS logic circuit according to claim 1 further comprising second transmisison means coupled between said base of said first bipolar transistor and said output terminal and coupled to said second input terminal for increasing the voltage swing on said output terminal.

4. A BICMOS logic circuit comprising:

a first input terminal;

a second input terminal;

an output terminal;

a first voltage terminal;

a second voltage terminal;

a first bipolar transistor having its collector-emitter path coupled between said first voltage terminal and said output terminal and having a base;

a second bipolar transistor having its collector-emitter path coupled between said output terminal and said second voltage terminal and having a base;

a first CMOS transistor having a gate coupled to said first input terminal and a source-drain current path;

a second CMOS transistor having its source-drain current path coupled between said base of said first bipolar transistor and said second voltage terminal and a gate coupled to said first input terminal;

a third CMOS transistor having a gate coupled to said input terminal and a source-drain current path; and a fourth CMOS transistor having its source-drain current path coupled between said base of said second bipolar transistor and said second voltage terminal and a gate coupled to said first input terminal;

a fifth CMOS transistor having a gate coupled to said second input terminal and its source-drain current path coupled to said source-drain current path of said first CMOS transistor, said source-drain current path of said third and sixth CMOS transistors coupled between said first voltage terminal and said base of said first bipolar transistor;

a sixth CMOS transistor having its source-drain current path coupled between said base of said first bipolar transistor and said second voltage terminal and a gate coupled to said second input terminal;

a seventh CMOS transistor having a gate coupled to said second input terminal and its source-drain current path coupled to said source-drain current path of said third CMOS transistor, said source-drain current paths of said third and seventh CMOS transistors coupled between said output terminal and said base of said second bipolar transistor; and an eighth CMOS transistor having its source-drain current path coupled between said base of said second bipolar transistor and said second voltage terminal and a gate coupled to said base of said first bipolar transistor.

5. The BICMOS logic circuit according to claim 4 further comprising an inverter coupled between said first input terminal and said gate of said third CMOS transistor.

* * * * *

UNITED STATES PATENT AND TRADEMARK OFFICE
CERTIFICATE OF CORRECTION

PATENT NO. : 4,703,203

DATED : Oct. 27, 1987

INVENTOR(S) : Michael G. Gallup et al

It is certified that error appears in the above-identified patent and that said Letters Patent is hereby corrected as shown below:

Column 5, claim 1, line 14, after "between" delete --said--.

Signed and Sealed this

Thirteenth Day of December, 1988

*Attest:*

DONALD J. QUIGG

*Attesting Officer*  *Commissioner of Patents and Trademarks*